US 6,465,744 B2

(12) United States Patent
Baker et al.

(10) Patent No.: US 6,465,744 B2
(45) Date of Patent: *Oct. 15, 2002

(54) GRADED METALLIC LEADS FOR CONNECTION TO MICROELECTRONIC ELEMENTS

(75) Inventors: David R. Baker, Cupertino; Hung-Ming Wang, San Jose, both of CA (US)

(73) Assignee: Tessera, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/277,521

(22) Filed: Mar. 26, 1999

(65) Prior Publication Data

US 2002/0115356 A1 Aug. 22, 2002

Related U.S. Application Data

(60) Provisional application No. 60/079,636, filed on Mar. 27, 1998.

(51) Int. Cl.⁷ ................................................. H05K 1/16
(52) U.S. Cl. ........................ 174/260; 174/255; 257/786; 361/761
(58) Field of Search ................................ 174/260, 261, 174/34, 72 TR, 117 FF, 255; 29/835, 840; 439/6.5, 74, 84, 60; 257/621, 778, 781, 786; 361/760, 761

(56) References Cited

U.S. PATENT DOCUMENTS 4,658,090 A * 4/1987 Coon .................... 174/117 FF
5,137,461 A * 8/1992 Bindra et al. .................. 439/74
5,148,265 A    9/1992 Khandros et al. .............. 357/80
5,230,144 A    7/1993 Ootsuki ........................ 29/827
5,398,863 A    3/1995 Grube et al. ................. 228/106
5,489,749 A    2/1996 Distefano et al. ........... 174/261
5,491,302 A * 2/1996 Distefano et al. ........... 174/260
5,518,964 A    5/1996 Distefano et al. ........... 437/209
5,629,239 A    5/1997 Distefano et al. ............. 216/14
5,731,631 A * 3/1998 Yama et al. ................. 257/778
5,821,609 A   10/1998 Distefano et al. ........... 257/669
5,830,782 A   11/1998 Smith et al. ................. 438/123
5,966,592 A * 10/1999 Beroz et al. ................. 438/111
6,023,103 A *  2/2000 Chang et al. ................ 257/784

OTHER PUBLICATIONS

Transformational Superelasticity in Sputtered Titanium–Nickel Thin Films, Li Hou and D.S. Grummon, Scripta Metallurgia et Materialia, vol. 33, No. 6 pp. 989–995, 1995, Elsevier Science Ltd., 0956–716X(95)00311–8.

Orthorhombic Martensite, Intermetallic Precipitates and Retained Austenite in Ti–Rich Ti (NI+CU) Sputtered Thin Films, L. Chang and D.S. Grummon, Dept. Of Metallurgy, Mechanics and Materials Science, Mat. Res. Soc. Symp. Proc. vol. 246, 1992.

* cited by examiner

Primary Examiner—Albert W. Paladini
(74) Attorney, Agent, or Firm—Lerner, David, Littenberg, Krumholz & Mentlik, LLP (57) ABSTRACT

Flexible leads for making electrical connection in microelectronic components includes two metallic layers. The structural or core layer of the lead is formed having a hardness greater than the hardness of the second layer. The relative hardness between the first and second layers is achieved by controlling the grain size during deposition of the respective layers from an electroless or electroplating bath.

37 Claims, 4 Drawing Sheets

GRADED METALLIC LEADS FOR CONNECTION TO MICROELECTRONIC ELEMENTS

The present invention claims the benefit of the U.S. Provisional Application No. 60/079,636 filed on Mar. 27, 1998, the disclosure of which is incorporated by reference herein.

FIELD OF THE INVENTION

The present invention relates in general to microelectronic elements such as semiconductor chip assemblies, and more particularly, to flexible leads for use in such microelectronic elements, as well as methods of manufacturing same.

BACKGROUND OF THE INVENTION

Semiconductor chips typically are connected to external circuitry through contacts on the surface of the chip. The contacts may be disposed in a grid on the front surface of the chip or in elongated rows extending along the edges of the chip's front surface. Each such contact must be connected to an external circuit element such as a circuit trace on a supporting substrate or circuit panel. In the conventional wire bonding process, the back surface of the chip is physically mounted on the substrate. A bonding tool bearing a fine wire is engaged with an individual contact on the face surface of the chip so as to bond the wire to the contact. The tool is then moved to a contact pad of the circuit on the substrate, while dispensing wire through the tool, until the tool engages the contact pad on the substrate and the wire is bonded thereto. This process is repeated for each contact.

In a tape automated bonding process, a dielectric supporting tape is provided with a hole slightly larger than the chip. Metallic leads are provided on the dielectric tape are cantilevered into the hole in the tape. An inner end of each lead projects inwardly beyond the edge of the hole. These plural leads are arranged side-by-side in rows. Each row of contacts on the chip is aligned with one such row of leads. The inner ends of the leads are bonded to the contacts of the chip by ultrasonic or thermocompression bonding. The outer ends of the leads are connected to the external circuitry.

The rapid evolution of the semiconductor art has created continued demand for incorporation of progressively greater numbers of contacts and leads in a given amount of space. U.S. Pat. No. 5,489,749, the disclosure of which is hereby incorporated by reference herein, offers one solution. As disclosed in certain embodiments of the patent, a semiconductor chip connection component may include a plurality of electrically conductive leads and may also include a support structure such as a flexible, dielectric film with a compliant, typically elastomeric underlayer disposed beneath the flexible film. Each such lead desirably is connected to a terminal disposed on the surface of the support structure. A connection section of each lead extends across a gap such as in the nature of a slot in the support structure. A first end of each connection section, connected to one of the terminals, is permanently attached to the support structure, whereas the opposite second end of the connection section is releasably attached to the support structure. For example, the second end of each connection section may be connected through a frangible section connecting the second end to a bus structure anchored on the support structure.

In certain processes disclosed in the '749 Patent, the connection component is juxtaposed with the chip so that the support structure, and preferably a compliant layer thereof, overlies the contact bearing surface of the chip and so that the gap or slot in the support structure is aligned with a row of contacts on the chip. This process serves to align each connection section with a contact on the chip. After placement of the connection component on the chip, each lead is engaged by a bonding tool. The bonding tool moves downwardly towards the surface of the chip. As the bonding tool moves downwardly, it disengages the second end of each lead connection section from the support structure, as by breaking the frangible section of the lead, and moves the connection section downwardly into engagement with the chip contact. At the same time, guide surfaces on the bottom of the bonding tool engage the connection section and guide it into more precise alignment with the associated contact. The bonding tool then bonds the connection section to the contact.

The end supported lead bonding processes according to the '749 Patent offer numerous advantages. Because each lead is supported at both ends prior to bonding, it can be maintained in position until it is captured by the bonding tool. The bonding tool will reliably capture the correct lead, and hence there is little chance that an incorrect lead will be bonded to a contact. Moreover, the products resulting from the disclosed processes allow free movement of the terminals on the support structure relative to the chip after connection, both in the X and Y directions, parallel to the chip surface, and in the Z or compliance direction perpendicular to the chip surface. Thus, the assembly can be readily tested by engaging a multiple probe test fixture with the terminals. When the terminals on the support structure are bonded to contact pads of a substrate, such as by solder bonding or other processes, the assembly can compensate for differential thermal expansion between the chip and the substrate, such as by flexing of the leads and deformation of the flexible support structure.

Certain components and processes disclosed in the '749 Patent can be used to fabricate microelectronic elements such as semiconductor chip assemblies with closely spaced leads. Merely by way of example, rows of connection sections may be provided side-by-side at center-to-center spacing of about 100 micrometers or less, and may be successfully bonded to the contacts of the chip. Additional improvements in the bonding structures and techniques, as set forth in the commonly assigned U.S. Pat. Nos. 5,398,863 and 5,491,302, the disclosures of which are hereby incorporated by reference herein, still further facilitate bonding of closely spaced leads and formation of reliable assemblies even where the leads are extremely small, using the basic techniques set forth in the '749 Patent.

Connection components typically have a reduced fatigue life. It is therefore desirable to provide leads with a structure which reinforces the lead, particularly in the fatigue susceptible regions of the lead. The most fatigue susceptible regions are those regions which are most distorted in the fabrication of the component, for example, in the shoulder region and heel region. Reinforcing at least these regions enhances the fatigue life of the connection component and completed assembly. It is also desirable to provide a lead structure which in addition to being reinforced against fatigue, promotes more efficient coupling of energy between the bonding tool and the bond interface between the bottom of the lead and the chip contact. This in turn allows reduced bonding force, bonding energy and/or bonding time, or provides a strong bond with the same force, energy and time so that connection components can be fabricated more economically.

In certain structures taught in copending U.S. patent application Ser. No. 09/179,273 filed on Oct. 27, 1998 entitled Layered Lead Structures, the disclosure of which is incorporated herein by reference, a connection component includes flexible leads incorporating a structural material such as copper, gold, alloys of these metals or other metals. Each lead is provided with a thin layer of a fatigue resistant alloy, such as the alloys commonly referred to as a shape memory alloys. The fatigue resistant alloy preferably is provided on the bonding or bottom side of the lead which is bonded to a contact during use of the component.

Most preferably, the layer of fatigue resistant alloy is provided at least in the bond region, i.e., the region of the lead which is bonded to the contact when the component is used to make connections with a microelectronic element. In particular, the fatigue resistant material is provided in the region of the lead which forms the "heel" of the bond. A layer of a readily bondable material such as gold, palladium or other metal compatible with the contact to which the lead is to be bonded is applied on the bottom or bond side of the lead covering the fatigue resistant alloy at least in the area of the lead which will engage the contact during use. The lead structures according to certain embodiments of these copending applications are asymmetrical, in that the fatigue resistant alloy and bondable metal are disposed only on the bottom side of the structural metal.

Another flexible lead for use in a microelectronic connection component as disclosed in the '273 Application is provided with an asymmetrical distribution of bonding metal at least in the bond region. The lead incorporates a layer of a structural metal, desirably copper, copper based alloy or other relatively low cost metal. A first layer of a readily bondable metal such as gold or gold based alloy (e.g., an alloy containing about 50% gold or more) or palladium is provided on the bottom surface of the structural metal layer. The top surface of the structural metal layer may be devoid of the bonding metal in the bond region or else may have a second layer of bonding metal which is thinner than the first layer of bonding metal. Typically, the first layer of bonding metal is thinner than the structural metal.

A layer of a barrier metal such as nickel or a nickel based alloy which is adapted to retard alloying of the structural metal and the bonding metal by diffusion optionally may be provided between the structural metal layer and the first layer of bonding metal. The barrier metal layer typically is thinner than the first layer of bonding metal and may include a fatigue resistant alloy. A similar barrier layer can be provided between the structural metal and the second layer of bonding metal, if such second layer is used. The leads typically are provided on a support structure such as a dielectric layer.

The disclosure of copending U.S. patent application Ser. No. 08/560,272, filed on Nov. 21, 1995 entitled A Structure and Method for Making a Compliant Lead for a Microelectronic Device is hereby incorporated by reference herein. The '272 Application discloses a method of treating a lead in a chip package. A conductive lead is positioned such that it extends across a gap in a dielectric substrate and is secured at either end to a first surface of the substrate. Directed energy is then applied to a desired portion of the surface of the lead within the gap. As a result of the application of energy, a surface layer of the lead is recrystallized thereby creating a fine grain, dense surface layer of lead material. Surface contaminants may be vaporized and contaminants at the grain boundaries of the recrystallized surface layers may be driven away from the grain boundaries such that a treated lead is more ductile and has better resistance to thermal cycling after the lead has been attached to a chip contact.

Notwithstanding the above improvements in the construction of fatigue resistant leads for connection components, it can be appreciated that there is still the desirability of providing additional improvements in the construction of flexible leads for use in microelectronic elements such as semiconductor chip assemblies and the like which address the aforementioned desirable features for such leads.

SUMMARY OF THE INVENTION

In accordance with one embodiment of the present invention there is described a lead having a bond region adapted for connection to a microelectronic element. The lead includes a first layer of a metal having top and bottom surfaces, a second layer of the metal on the top surface of the first layer at least within the bond region, the metal in the first layer having a hardness greater than the hardness of the metal in the second layer.

The hardness of the metal layers is controlled by depositing the metal layers having different grain size. The resulting lead may also be coated with a bonding material along all or a portion of the lead. In accordance with the preferred embodiment, the metal layers are copper while the bonding material is gold.

In accordance with another embodiment of the present invention there is described a microelectronic component having a supporting structure and at least one lead connected to the supporting structure. The lead includes a bond region, a first layer of a metal having top and bottom surfaces, a second layer of the metal on the top surface of the first layer at least within the bond region, the metal in the first layer having a hardness greater than the hardness of the metal in the second layer.

In accordance with another embodiment of the present invention there is described a method of making an electrical connection to a microelectronic component having at least one contact. The method includes the steps of juxtaposing a connection component with a microelectronic component, the connection component having a supporting structure and at least one lead connected to the supporting structure, the lead including a bond region adapted to be aligned with the contact, a first layer of a metal having top and bottom surfaces, a second layer of the metal on the top surface of the first layer at least within the bond region, the metal in the first layer having a hardness greater than the hardness of the metal in the second layer and bonding the bond region of the lead to the contact on the microelectronic component.

In accordance with another embodiment of the present invention there is described a method of making a lead having a bond region. The method includes the steps of depositing a first layer of a metal having top and bottom surfaces, depositing a second layer of the metal onto the top surface of the first layer at least within the bond region, controlling the steps of depositing the first and second layers such that the grain size of the metal in the first layer is smaller than the grain size of the metal in the second layer.

BRIEF DESCRIPTION OF THE DRAWINGS

The above description, as well as further objects, features and advantages of the present invention will be more fully understood with reference to the following detailed description of graded metallic leads for connection to microelectronic elements, when taken in conjunction with the accompanying drawings, wherein.

DETAILED DESCRIPTION OF THE PREFERRED EMBODIMENTS

In describing the preferred embodiments of the subject matter illustrated and to be described with respect to the drawings, specific terminology will be resorted to for the sake of clarity. However, the invention is not intended to be limited to the specific terms so selected, and is to be understood that each specific term includes all technical equivalence which operate in a similar manner to accomplish a similar purpose.

Figure 1:
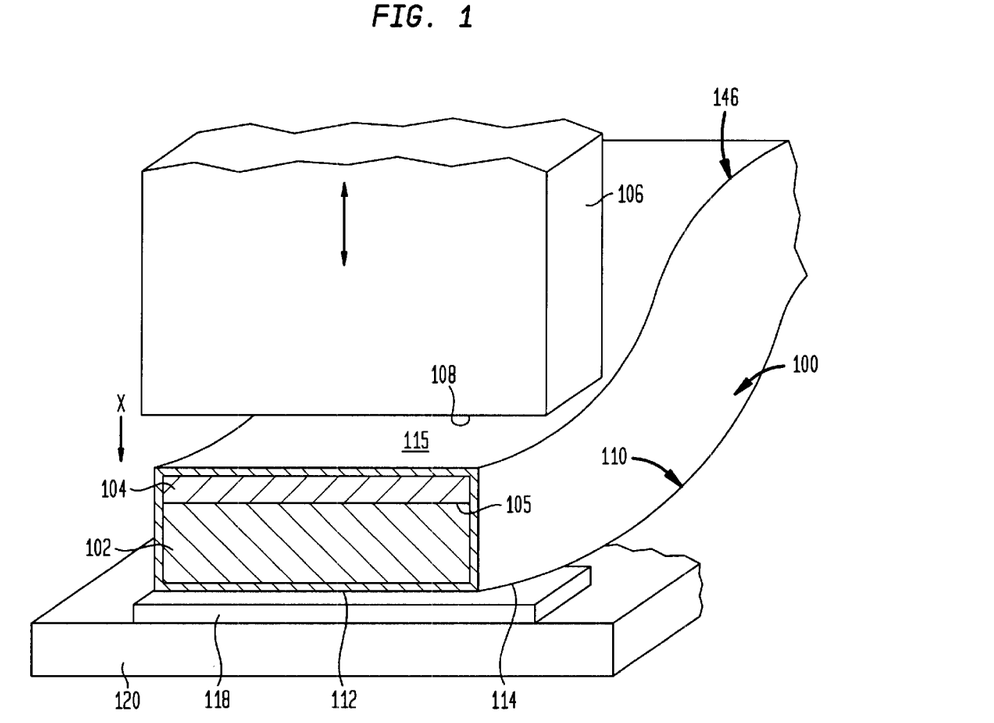
FIG. 1 is a perspective view of a flexible lead constructed in accordance with one embodiment of the present invention for connection to a microelectronic component.

Referring now to the drawings, wherein like reference numerals represent like elements, there is shown in FIG. 1 a flexible elongated lead generally designated by reference numeral 100. The flexible lead 100 which is specifically suited for use in microelectronic elements such as semiconductor chip assemblies, interposers, microelectronic connection components and the like includes a structural metal body formed from plated metal layers having different hardness values. In accordance with one embodiment, the lead 100 is formed from at least two superimposed layers 102, 104 of copper having different grain size in the thickness direction "X". The first layer 102, typically the core or structural layer of the lead 100, is formed from copper having a relatively fine grain size to provide the core layer with high mechanical strength and long fatigue life. The second copper layer 104 having a relatively large grain size is deposited on the top surface 105 of the core layer 102 at least in the region which will be engaged by a bonding tool 106 used for thermosonic or compression bonding.

By virtue of the respective grain sizes of the two layers 102, 104, the core layer will be relatively hard, while the outer second layer will be relatively soft. By way of example, the hardness of the core layer 102 may be in the range of about $HV_{0.025}80$ to $HV_{0.025}100$, while the hardness of the second copper layer 104 may be in the range of about $HV_{0.025}50$ to $HV_{0.025}70$. Preferably the hardness of the core layer 102 will be about $HV_{0.025}90$, while the hardness of the second layer 104 will be about $HV_{0.025}60$. $HV_{0.025}80$ means a Vickers microhardness of 80 at a loading of 0.025, which nomenclature will be used throughout this application. Selective formation of the soft copper layer 102 over selected portions of the lead 100 may be accomplished using suitable masking techniques during the plating process. However, the entire top surface 105 of the core layer 102 may be provided with a soft copper layer 104 if desired.

The soft copper layer 104 facilitates coupling of the bonding tool 106 to the lead 100. This will also minimize any deformation of the lead 100 such as by cratering of the lead surface during the bonding process. In addition, the soft copper layer 104 will have the tendency to increase the bonding tool life. Further, leads 100 formed with a hard copper core 102 and soft copper layer 104 on the top surface have both longer fatigue life and improved ultrasonic compression bonding properties. In particular, the high strength copper core layer 102 provides improved fatigue resistance within various regions of the lead 100 such as the heel region 110 of the leads, i.e., the upwardly curving region close to the contact on the bond side of the lead as to be described hereinafter. Typically, the core layer 102 of fine grain copper is thicker than the soft copper layer 104 of large grain copper. For example, the core layer 102 typically is about 10–20 microns thick, and preferably about 15 microns thick, whereas the outer soft copper layer 104 is typically about 2 to 10 microns thick, and preferably about 5 microns thick.

The composite metal layers of the lead 100 having different grain sizes and/or structures can be formed from a single copper bath using electroless and/or electroplating techniques. Specifically, by varying the plating conditions within the same plating bath, for example, duty cycle(which refers to the type of current being applied, e.g., direct current or pulse current), current per unit area, voltage, temperature and the like, it is possible to deposit copper from a single copper sulfate bath having different mechanical properties, e.g., hardness, by virtue of having different grain sizes and/or structures. By different grain structures it is meant, for example, that the grain may be deposited columnarly or equiaxially. In this regard, the core layer 102 is deposited from the plating bath such that it has very fine grained copper which gives the lead 100 overall high strength and fatigue resistance. This is particularly advantageous in the heel region 110 of each lead 100 which is subject to fatigue cracking, as well as the shoulder region as to be described. On the other hand, the second layer 104 of soft copper which is deposited onto the core layer 102 has relatively large grains to provide the layer with a hardness less than that of the core layer. The present invention can use pulse plating conditions during the copper deposition process from a single plating bath to provide the graded copper lead, having varying hardness in cross-sectional thickness for use in microelectronic packages.

It is also contemplated that other metals such as nickel, gold, palladium and the like may be used for the core layer 102 and softer second layer 104. As such, the hardness of the layers 102, 104 will be dependent on the particular metal and the grain size produced during the electroless or electroplating process.

The leads 100 may be coated with a bonding material layer 112 such as gold, and preferably a soft gold layer having a relatively fine grain structure. The gold layer 112 is typically about 0.5 to 3 microns thick, and most preferably about 2 microns thick. The gold layer 112 provides oxidation resistance and reduces small fatigue crack growth rates, particularly in the heel region 110, as well as providing a bonding material in the bonding region 114 of the lead for the contacts of the semiconductor chip. In the preferred embodiment, the lead 100 has a conformal coat of gold surrounding the entire lead.

In use, the leads 100 are generally bonded to contacts on a semiconductor chip or other microelectronic element by a process such as ultrasonic bonding or preferably thermocompression or thermosonic bonding. In the bonding process, each lead 100 is engaged by a bonding tool 106 which bears on the top surface 115 of the lead in the bonding region 114 and forces the lead downwardly into engagement with the underlying contact. Energy supplied through the bonding tool 106 causes the lead 100 to join with the contact. The relatively soft copper layer 104 of the leads 100 in accordance with the present invention promotes more efficient coupling of energy between the bonding tool 106 and the lead. This, in turn, allows reduced bonding force which minimizes cratering of the underlying chip contacts, bonding energy and/or bonding time, and provides a stronger bond with the same force, energy and time.

The fine grained copper core layer 102 has better fatigue resistance than the outer large grained layer 104. After the lead 100 is bonded to the semiconductor chip contacts and bent to the vertically curved configuration such as shown in FIG. 1, the region adjacent the bonding region 114 forms the commonly referred to heel region 110. The core layer 102 reinforces the lead 100 against fatigue in the heel region 110, which is typically the most fatigue susceptible region of the lead.

The present invention can be employed with various lead configurations, including conventional tape automated bonding leads and those depicted in U.S. Pat. Nos. 5,489,749; 5,491,302; 5,629,239, and 5,518,964, the disclosures of which are hereby incorporated by reference herein. As further discussed in these patents, the leads 100 can be provided on dielectric layers such that the leads extend into or across gaps in the dielectric layers and so that the leads can be bent downwardly towards contacts on the surface, to form a bent configuration such as shown in FIG. 1.

A microelectronic element incorporating leads 100 in accordance with one embodiment of the present invention is shown in FIGS. 1 through 4. As used herein, the term microelectronic element or component refers to semiconductor chips, wafers, circuit boards, interposers and any other electrical assembly incorporating conductive elements such as leads and/or contacts and which are useful in mounting and connecting electronic devices such as semiconductor devices.

Figure 2:
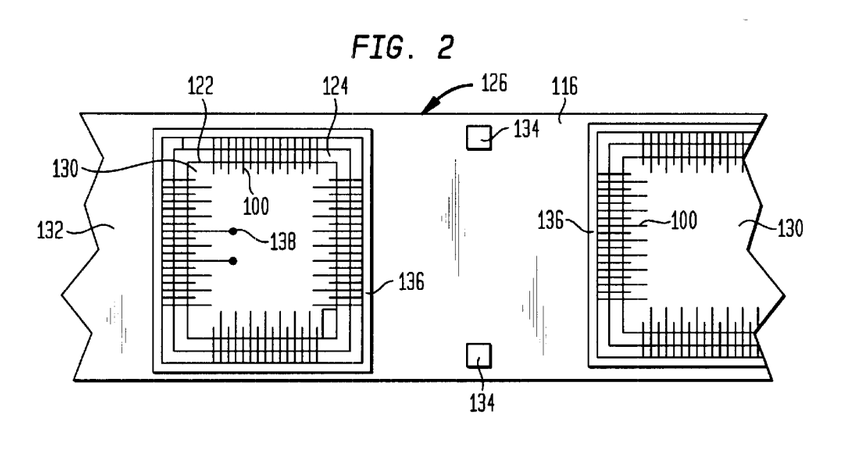
FIG. 2 is a diagrammatic plan view of a microelectronic component incorporating a flexible lead constructed in accordance with the present invention.
Figure 3:
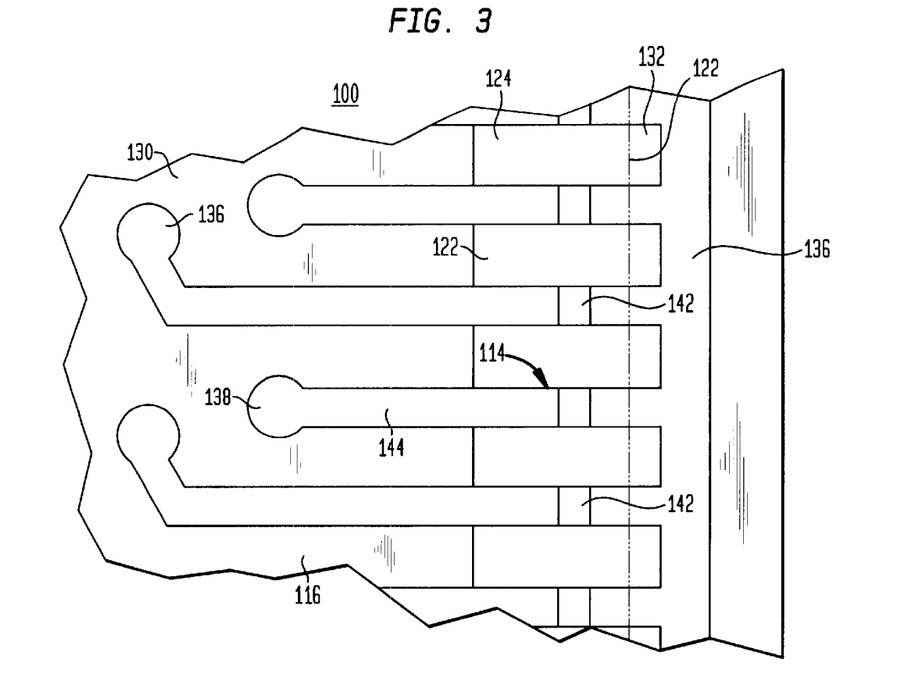
FIG. 3 is an enlarged fragmentary top plan view of a portion of a microelectronic component incorporating a flexible lead constructed in accordance with the present invention.
Figure 4:
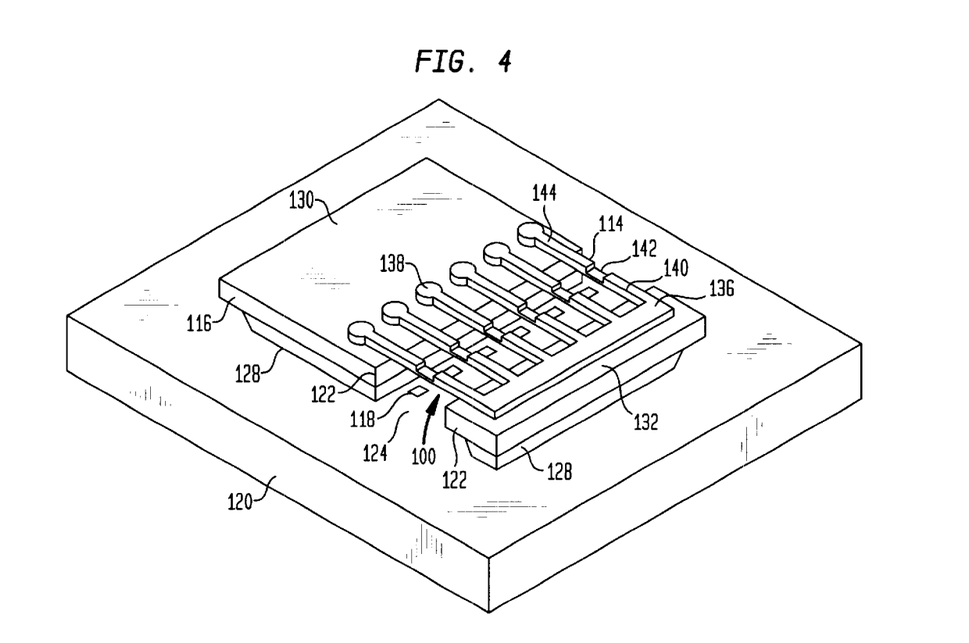
FIG. 4 is a perspective view showing a portion of a microelectronic component adapted for electrical connection to another microelectronic component including a plurality of flexible leads constructed in accordance with the present invention.

Several components will be described which will be understood as several applications of the leads 100 which are constructed in accordance with the present invention and should be taken by way of example, as opposed to limitation. For example, in some applications of the invention, the leads 100 include a frangible portion, whereas, in other applications, a frangible portion is not included. More specifically, a plurality of leads 100 such as shown in FIG. 1 are provided on a supporting structure 116, each lead having a region bondable to contacts 118 provided on a microelectronic element 120, such as a semiconductor chip. Edges 122 of the supporting structure 116 form a gap 124 across which the leads 100 extend to the microelectronic element 120 and contact 118. The supporting structure 116, as shown in FIGS. 2–4, may comprise a flexible, sheet-like dielectric layer incorporated in a tape 126. A compliant layer 128, as best seen in FIG. 4, is desirably provided beneath the dielectric supporting structure 116. The support structure 116 of each component has gaps 124 dividing the support structure into a central portion 130 and a peripheral portion 132. The tape 126 may be provided with features such as sprocket holes 134 to facilitate the production process, as used in tape automated bonding methods.

A plurality of elongated electrically conductive buses 136 extend on the peripheral portion 132 of the dielectric supporting structure 116 alongside the gaps 124, forming a loop around the central portion 130 and the gaps. Terminals 138 are disposed on the central portion 130 of the supporting structure 116 and a plurality of leads 100 extend outwardly from the terminals, across the gaps 124 to the bus 136. Although only a few leads 100 and terminals 138 are illustrated in the drawings, it should be appreciated that a typical component may include hundreds of leads 100 and terminals 138. The terminals 138, although illustrated in FIGS. 2–4 as disposed side by side, are typically distributed over substantially the entire central portion 130 of the support structure 116.

A lead 100 constructed in accordance with one embodiment of the invention, as best shown in FIG. 4, may further include a securement section 140 on peripheral portion 132 of the support structure 116, a frangible section 142 extending outwardly across one of the gaps 124 from the securement section, a bonding region 114 joined to the frangible section, and a terminal section 144 on central portion 130 attached to the terminals 138 remote from securement section. As seen in FIGS. 3 and 4, the frangible section 142 lies above gap 124.

The supporting structure 116 having leads 100 thereon may be manufactured by forming the leads and bus 136 on a dielectric layer using electroplating and pattern etching processes. One method of forming frangible sections 142 in the leads 100 is to provide a mask to protect the desired portions of the dielectric supporting structure 116 and leads while a laser or chemical etching is applied to form the frangible sections by removal of a portion of the lead material. A second mask protects the dielectric supporting structure 116 while a laser forms the gaps 124 in the dielectric layer in registration with the frangible sections 142. The frangible sections 142 can be formed by other processes such as by coining as disclosed in U.S. Provisional Application No. 60/080,519 filed on Apr. 3, 1998, the disclosure of which is incorporated herein by reference. The supporting structure 116 with leads 100 may be manufactured as more fully described in U.S. Pat. No. 5,629,239. Other structures and methods are disclosed in U.S. Pat. No. 5,821,609; U.S. patient application Ser. No. 08/845,786 filed on April 25, 1997 and Ser. No. 09/110,001 filed on Jul. 2, 1998; and U.S. Provisional Application No. 60/085,891 filed on May 18, 1998 and No. 60/087,801 filed on Jun. 3, 1998, the disclosures of which are all hereby incorporated by reference herein.

In the bonding process, as best seen in FIGS. 1 and 4, the bonding regions 114 of leads 100 are bonded to the contacts 118 on the semiconductor chip or other microelectronic element 120 by a process such as ultrasonic bonding or preferably thermocompression or thermosonic bonding. The supporting structure 116 with leads 100 thereon is positioned on the microelectronic element 120 so that rows of contacts 118 are aligned with gaps 124 and the leads 100. The bonding region 114 of each lead 100 is engaged by a bonding tool 106 which bears on the top surface of the lead in the bonding region and forces the lead downwardly into engagement with the contact 118. As the bonding tool 106 moves each lead 100 downwardly toward the contact 118, frangible section 142 breaks, as described more fully in the '239 Patent. The bonding region 114 is moved into engagement with the contact 118, and the lead 100 is then permanently bonded to contact 118 by the bonding tool 106 as shown in FIG. 1.

As shown in FIG. 1, the lead 100 takes on a curved shape after being manipulated by the bonding tool 106 and displaced downwardly toward the contact 118. The curved portion closest contact 118 is an upwardly curved portion called the heel region 110 of the lead 100. The heel region 110, adjacent the bonding region 114, was distorted from its originally planar shape to an upwardly curved shape by the bonding tool 106. Another curved portion formed in the bonding process, adjacent the terminal section 144 on the central portion 130 of the supporting structure 116, is the shoulder region 146, see FIG. 1. The shoulder region 146 was distorted from its originally planar shape to a downwardly curved shape by the bonding tool 106. It is believed that the shoulder and heel regions 110, 146 are the most fatigue susceptible portions of the lead 100 in the connection component, i.e., being the most distorted regions. Although the present invention is not limited by any theory of operation, it is believed that fatigue cracks begin on the surface of the structural metal and propagate into the interior of the structural metal. As previously described, the large grained copper core layer 102 of the lead 100 has better fatigue resistance than the outer fine grained layer 104. As a result, the core layer 102 reinforces the lead 100 against fatigue along the entire length of the lead including the heel region 110 and shoulder region 146, which again are typically the most fatigue susceptible regions of the lead.

Figure 5:
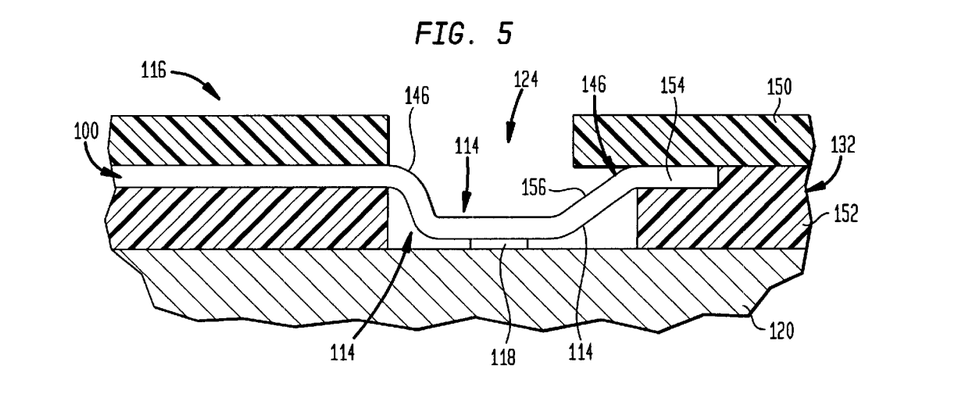
FIG. 5 is a cross-sectional view showing one application of a flexible lead constructed in accordance with the present invention.

FIG. 5 shows another application of the leads 100 in a microelectronic component 120 which does not include the frangible sections 142 discussed above. The supporting structure 116 of this type of component includes a top layer 150 and a bottom layer 152 of dielectric material. Prior to the bonding process, the bonding region 114 extends across gap 124 in the supporting structure 116. As more fully described in U.S. Pat. No. 5,489,749, a securement section 154 is permanently mounted to the supporting structure 116 on the peripheral portion 132. The bonding tool 106 (not shown) engages the bonding region 114 of the lead 100, displacing the lead downwardly. A portion 156 of the lead 100 peels away from the top layer 150 to permit downward displacement of the bonding region 114. The securement section 154 remains loosely attached to the supporting structure 116. The bonding region 114 is permanently bonded to contact 118 on microelectronic element 120. In the bonding process, lead 100 is deformed to create a pair of heel regions 110 and a pair of shoulder regions 146 similar to the heel and shoulder regions discussed above. These regions are also believed to be fatigue susceptible portions of the lead 100. Lead 100 by virtue of its construction in accordance with the present invention will prevent the formation of fatigue cracks, as well as providing the lead with the desirable characteristics as discussed.

Figure 6:
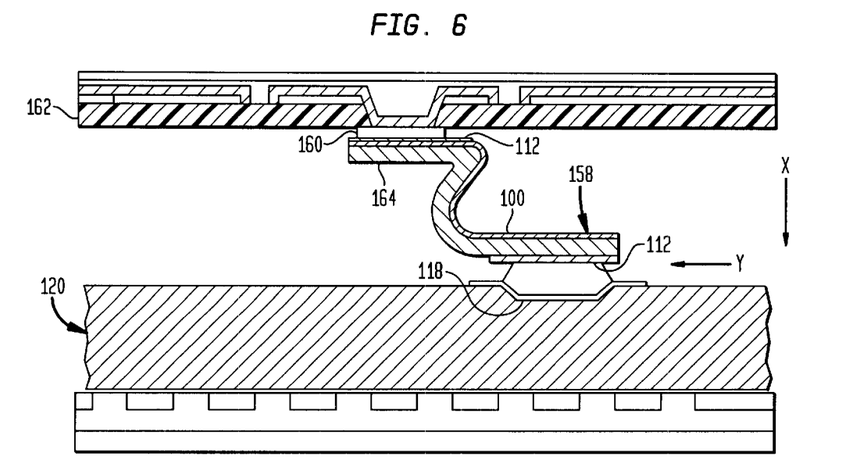
FIG. 6 is a cross-sectional view showing another application of a flexible lead constructed in accordance with the present invention.

Leads 100 may have other distorted regions which are relatively fatigue susceptible. FIG. 6 illustrates another application of the leads 100 in which a lead 100, which is formed into an S-shape, is attached to contact pads 118 on microelectronic element 120 at a tip end 158 of the lead and also attached to a terminal 160 on a dielectric sheet 162 at another terminal end 164. The microelectronic element 120 includes a series of semiconductor chips. The S-shaped lead 100 was formed by displacing the microelectronic element 120 with respect to the sheet 162 vertically in the X direction and horizontally in the Y direction as more fully described in U.S. Pat. No. 5,518,964. Other alternative lead shapes are disclosed in U.S. Pat. No. 5,830,782, the disclosure of which are hereby incorporated by reference herein.

Figure 7:
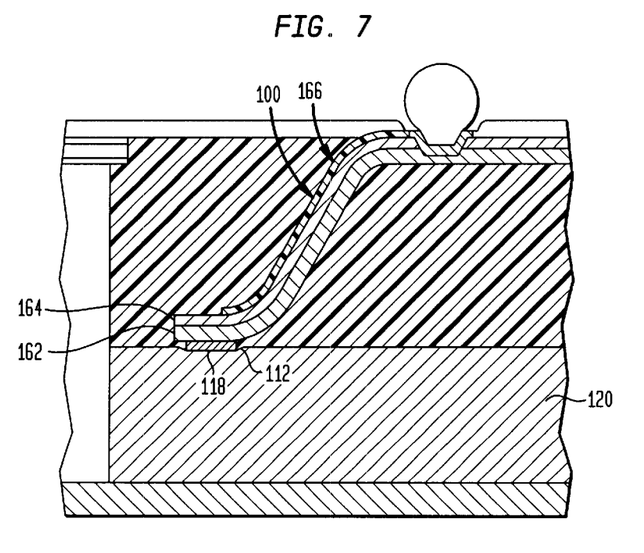
FIG. 7 is a cross-sectional view showing another application of a flexible lead constructed in accordance with the present invention.

The invention can also be employed in leads 100 which include a polymer layer as shown in FIG. 7. Preferably, the polymer layer 166 is absent in the bonding region 114, or in the part of the bonding region engaged by the bonding tool 106, to permit efficient energy coupling between the tool and the bond interface. The polymer layer 166 may be provided on either side of the lead 100. Combined metal and polymer lead structures are shown in the abovementioned U.S. Pat. No. 5,489,749, and in U.S. patent application Ser. No. 08/715,571 filed on Sep. 18, 1996, the disclosures of which are also incorporated by reference herein.

As thus far described, the leads 100 may extend on either side of a dielectric layer included in a support structure, and may or may not include a frangible section. Thus, the lead 100 depicted in the drawing extends on the top surface of the dielectric layer, remote from the semiconductor chip or other microelectronic element having the contact to which the lead is bonded. However, the lead 100 may extend across the dielectric layer on the bottom surface. Also, the support structure need not include a dielectric layer, but instead may include a metallic lead frame which is used to hold the leads temporarily and which is removed from the leads during or after bonding.

Although the invention herein has been described with reference to particular embodiments, it is to be understood that these embodiments are merely illustrative of the principles and application of the present invention. It is therefore to be understood that numerous modifications may be made to the illustrative embodiments and that other arrangements may be devised without departing from the spirit and scope of the present invention as defined by the appended claims.

What is claimed:

1. A lead having a bond region adapted for connection to a microelectronic element, said lead comprising a first layer of a metal having top and bottom surfaces, a second layer of said metal on said top surface of said first layer at least within said bond region, said metal in said first layer having a hardness greater than the hardness of said metal in said second layer.

2. The lead as claimed in claim 1, wherein said metal in said first layer has a grain size substantially smaller than the grain size of said metal in said second layer.

3. The lead as claimed in claim 2, wherein said first layer is coextensive with said second layer.

4. The lead as claimed in claim 1, wherein said first layer in said bond region is thicker than said second layer in said bond region.

5. The lead as claimed in claim 4, wherein said first layer in said bond region is about 10–20 microns thick, and said second layer in said bond region is about 2–10 microns thick.

6. The lead as claimed in claim 1, wherein said metal comprises copper or copper alloy.

7. The lead as claimed in claim 1, further including a layer of a bonding material deposited onto the bottom surface of said first layer at least within said bond region.

8. The lead as claimed in claim 7, further including a layer of a bonding material deposited onto the top surface of said second layer at least within said bond region.

9. The lead as claimed in claim 7, wherein said bonding material comprises gold.

10. The lead as claimed in claim 7, wherein said layer of bonding material has a thickness of about 0.5 to 3 microns.

11. The lead as claimed in claim 1, wherein said first layer has a hardness in the range of about $HV_{0.025}80$ to $HV_{0.025}100$ and said second layer has a hardness in the range of about $HV_{0.025}50$ to $HV_{0.025_2}70$.

12. The lead as claimed in claim 1, wherein the bottom surface of said first layer is adapted to be connected in the bond region to said microelectronic element.

13. A microelectronic component comprising a supporting structure and at least one lead connected to said supporting structure, said lead including a bond region, a first layer of a metal having top and bottom surfaces, a second.layer of said metal on said top surface of said first layer at least within said bond region, said metal in said first layer having a hardness greater than the hardness of said metal in said second layer.

14. The component as claimed in claim 13, wherein said metal in said first layer has a grain size substantially smaller than the grain size of said metal in said second layer.

15. The component as claimed in claim 14, wherein said first layer is coextensive with said second layer.

16. The component as claimed in claim 15, wherein said first layer in said bond region is thicker than said second layer in said bond region.

17. The component as claimed in claim 16, wherein said first layer in said bond region is about 10–20 microns thick, and said second layer in said bond region is about 2–10 microns thick.

18. The component as claimed in claim 13, wherein said metal comprises copper or copper alloy.

19. The component as claimed in claim 13, further including a layer of a bonding material deposited onto the bottom surface of said first layer at least within said bond region.

20. The component as claimed in claim 19, further including a layer of a bonding material deposited onto the top surface of said second layer at least within said bond region.

21. The component as claimed in claim 19, wherein said bonding material comprises gold.

22. The component as claimed in claim 19, wherein said layer of bonding material has a thickness of about 0.5 to 3 microns.

23. The component as claimed in claim 13, wherein said first layer has a hardness in the range of about $HV_{0.025}80$ to $HV_{0.025}100$ and said second layer has a hardness in the range of about $HV_{0.025}50$ to $HV_{0.025}70$.

24. The component as claimed in claim 13, further including a frangible section in said lead.

25. The component as claimed in claim 13, wherein the bottom surface of said first layer is adapted for bonding to another microelectronic element.

26. A lead having a bond region constructed by depositing a first layer of a metal having top and bottom surfaces, depositing a second layer of said metal onto said top surface of said first layer at least within said bond region, controlling the steps of depositing said first and second layers such that the grain size of said metal in said first layer is smaller than the grain size of said metal in said second layer.

27. The lead as claimed in claim 26, wherein said metal in said first layer has a grain size substantially smaller than the grain size of said metal in said second layer.

28. The lead as claimed in claim 27, wherein said first layer is coextensive with said second layer.

29. The lead as claimed in claim 27, wherein said first layer in said bond region is thicker than said second layer in said bond region.

30. The lead as claimed in claim 29, wherein said first layer in said bond region is about 10–20 microns thick, and said second layer in said bond region is about 2–10 microns thick.

31. The lead as claimed in claim 26, wherein said metal comprises copper or copper alloy.

32. The lead as claimed in claim 26, further including a layer of a bonding material deposited onto the bottom surface of said first layer at least within said bond region.

33. The lead as claimed in claim 32, further including a layer of a bonding material deposited onto the top surface of said second layer at least within said bond region.

34. The lead as claimed in claim 32, wherein said bonding material comprises gold.

35. The lead as claimed in claim 32, wherein said layer of bonding material has a thickness of about 0.5 to 3 microns.

36. The lead as claimed in claim 26, wherein said first layer has a hardness in the range of about $HV_{0.025}80$ to $HV_{0.025}100$ and said second layer has a hardness in the range of about $HV_{0.025}50$ to $HV_{0.025}70$.

37. The lead as claimed in claim 26, wherein the bottom surface of said first layer is adapted for bonding to microelectronic component within the bond region of said lead.

* * * * *

UNITED STATES PATENT AND TRADEMARK OFFICE
CERTIFICATE OF CORRECTION

PATENT NO. : 6,465,744 B2
DATED : October 15, 2002
INVENTOR(S) : David R. Baker and Hung-Ming Wang It is certified that error appears in the above-identified patent and that said Letters Patent is hereby corrected as shown below:

<u>Column 10,</u>
Line 56, "$HV_{0.0252}70$" should read -- $HV_{0.025}70$ --

Signed and Sealed this

Sixth Day of April, 2004

JON W. DUDAS
*Acting Director of the United States Patent and Trademark Office*